United States Patent
Lee et al.

(10) Patent No.: US 11,753,711 B2
(45) Date of Patent: Sep. 12, 2023

(54) MASK FRAME AND DEPOSITION APPARATUS INCLUDING THE SAME

(71) Applicant: Samsung Display Co., Ltd., Yongin-Si (KR)

(72) Inventors: Jongyoon Lee, Hanam-si (KR); Seungjin Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/375,228

(22) Filed: Jul. 14, 2021

(65) Prior Publication Data
US 2022/0127710 A1  Apr. 28, 2022

(30) Foreign Application Priority Data
Oct. 28, 2020  (KR) .......................... 10-2020-0141198

(51) Int. Cl.
*C23C 14/04* (2006.01)
*H01L 51/00* (2006.01)
*B05C 21/00* (2006.01)
*H10K 71/16* (2023.01)

(52) U.S. Cl.
CPC .......... *C23C 14/042* (2013.01); *B05C 21/005* (2013.01); *H10K 71/166* (2023.02)

(58) Field of Classification Search
None
See application file for complete search history.

(56) References Cited

U.S. PATENT DOCUMENTS

| | | | | |
|---|---|---|---|---|
| 6,720,236 B2 * | 4/2004 | Yotsuya | ............... | C23C 14/042 438/455 |
| 7,282,240 B1 * | 10/2007 | Jackman | ............... | G03F 7/0002 427/282 |
| 7,987,812 B2 | 8/2011 | Kim et al. | | |
| 8,604,489 B2 * | 12/2013 | Hong | ............... | C23C 14/042 257/280 |
| 8,852,346 B2 * | 10/2014 | Lee | ............... | C23C 14/042 156/345.3 |
| 9,337,374 B2 * | 5/2016 | Kramer | ............... | H01L 31/188 |
| 9,583,709 B2 * | 2/2017 | Bang | ............... | H01L 51/0013 |

(Continued)

FOREIGN PATENT DOCUMENTS

| | | |
|---|---|---|
| KR | 10-1998-0066102 | 10/1998 |
| KR | 10-0646942 | 11/2006 |

(Continued)

OTHER PUBLICATIONS

Martin-Palma et al., "Silver-Based Low-Emissivity Coatings for Architectural Windows: Optical and Structural Properties", Solar Energy Materials and Solar Cells 53 (1998), pp. 55-66.

*Primary Examiner* — Jethro M. Pence

(74) *Attorney, Agent, or Firm* — F. Chau & Associates, LLC

(57) ABSTRACT

A mask frame includes a support substrate including a plurality of inner side surfaces. The plurality of inner side surfaces defines a first opening through the support substrate. A heat dissipation plate is disposed on the plurality of inner side surfaces. A plurality of fixing portions is disposed between the support substrate and the heat dissipation plate. The plurality of fixing portions includes a plurality of adhesive portions attaching the support substrate to the heat dissipation plate.

15 Claims, 9 Drawing Sheets

(56) References Cited

U.S. PATENT DOCUMENTS

| | | | |
|---|---|---|---|
| 9,644,256 B2* | 5/2017 | Ko | C23C 14/042 |
| 9,828,665 B2* | 11/2017 | Ikenaga | C23F 1/04 |
| 9,896,759 B2* | 2/2018 | Wu | C23C 14/24 |
| 10,301,715 B2* | 5/2019 | Yoo | B05C 21/005 |
| 10,422,029 B2* | 9/2019 | Kishimoto | C23C 14/24 |
| 10,829,847 B2* | 11/2020 | Zhang | C23C 14/042 |
| 10,865,473 B2* | 12/2020 | Liu | C23C 16/042 |
| 11,008,646 B2* | 5/2021 | Sakio | C23C 14/12 |
| 11,043,635 B2* | 6/2021 | Kishimoto | H05B 33/10 |
| 11,066,737 B2* | 7/2021 | Li | B05C 21/005 |
| 11,149,341 B2* | 10/2021 | Zhang | H01L 51/0011 |
| 11,279,999 B2* | 3/2022 | Aoki | H01L 51/001 |
| 11,380,546 B2* | 7/2022 | Ushikusa | C23C 14/24 |
| 11,434,559 B2* | 9/2022 | Aoki | B05C 21/005 |
| 11,484,971 B2* | 11/2022 | Nariya | B23K 26/21 |
| 11,486,031 B2* | 11/2022 | Ikenaga | C23F 1/02 |
| 11,501,992 B2* | 11/2022 | Ikenaga | H01L 51/0011 |
| 2005/0037136 A1* | 2/2005 | Yamamoto | C23C 14/12 |
| | | | 427/66 |
| 2006/0103289 A1* | 5/2006 | Kim | C23C 14/042 |
| | | | 313/402 |
| 2008/0063851 A1* | 3/2008 | Jackman | G03F 7/12 |
| | | | 428/220 |
| 2011/0220019 A1* | 9/2011 | Lee | C23C 14/042 |
| | | | 118/504 |
| 2014/0020628 A1* | 1/2014 | Wang | H01L 21/02104 |
| | | | 118/721 |
| 2015/0013601 A1* | 1/2015 | Lee | B05C 21/005 |
| | | | 118/504 |
| 2016/0201185 A1* | 7/2016 | Bai | C23C 14/042 |
| | | | 228/178 |
| 2018/0002803 A1* | 1/2018 | Niboshi | C23C 14/042 |
| 2018/0010231 A1* | 1/2018 | Ikenaga | C21D 6/001 |
| 2019/0372002 A1* | 12/2019 | Yamabuchi | H01L 51/56 |
| 2020/0101513 A1* | 4/2020 | Luo | B21D 11/02 |
| 2020/0168800 A1* | 5/2020 | Lee | C23C 14/042 |
| 2020/0199733 A1* | 6/2020 | Uchida | H01L 51/56 |
| 2020/0216944 A1* | 7/2020 | Chun | B05B 12/20 |
| 2021/0013415 A1* | 1/2021 | Kawasaki | H01L 51/56 |
| 2021/0102268 A1* | 4/2021 | Oka | C23F 1/02 |
| 2021/0108312 A1* | 4/2021 | Oka | C23F 1/28 |
| 2021/0273168 A1* | 9/2021 | Kishimoto | H05B 33/10 |
| 2021/0404049 A1* | 12/2021 | Xu | B05C 17/06 |
| 2021/0407800 A1* | 12/2021 | Shinno | C23C 14/042 |
| 2022/0035250 A1* | 2/2022 | Kim | C23C 14/225 |
| 2022/0290288 A1* | 9/2022 | Hong | B05C 21/005 |

FOREIGN PATENT DOCUMENTS

| | | |
|---|---|---|
| KR | 10-0688815 | 3/2007 |
| KR | 10-0708654 | 4/2007 |
| KR | 10-1052556 | 7/2011 |
| KR | 10-1607895 | 4/2016 |
| KR | 10-1663273 | 10/2016 |
| KR | 10-1693788 | 1/2017 |
| KR | 10-2033006 | 10/2019 |

* cited by examiner

MASK FRAME AND DEPOSITION APPARATUS INCLUDING THE SAME

CROSS-REFERENCE TO RELATED APPLICATION

This application claims priority under 35 U.S.C. § 119 to Korean Patent Application No. 10-2020-0141198, filed on Oct. 28, 2020 in the Korean Intellectual Property Office, the disclosure of which is incorporated by reference in its entirety herein.

1. TECHNICAL FIELD

The present inventive concepts relate to a mask frame and a deposition apparatus including the same. More particularly, the present inventive concepts relate to a mask frame including a heat dissipation plate and a deposition apparatus including the mask frame.

2. DISCUSSION OF RELATED ART

A mask is used to manufacture a display device. The mask may include openings defined therethrough, and components of the display device are manufactured on a substrate through the openings. For example, when the display device includes a light emitting element, organic materials required to manufacture a light emitting layer of the light emitting element are deposited on the substrate through the openings of the mask. The mask may be disposed on a mask frame. In addition, organic materials used to manufacture color filters are deposited on the substrate through the openings of the mask.

When a deposition process is repeated, the mask frame may be deformed due to heat. When the mask frame is deformed, organic materials may not be deposited in a precise manner which may result in errors in the manufacture of the display device, such as a decrease in pixel position accuracy.

SUMMARY

The present inventive concepts provide a mask frame that reduces or prevents deformation due to heat.

The present inventive concepts provides a deposition apparatus including the mask frame that reduces or prevents deformation due to heat.

According to an embodiment of the present inventive concepts, a mask frame includes a support substrate including a plurality of inner side surfaces. The plurality of inner side surfaces defines a first opening through the support substrate. A heat dissipation plate is disposed on the plurality of inner side surfaces. A plurality of fixing portions is disposed between the support substrate and the heat dissipation plate. The plurality of fixing portions includes a plurality of adhesive portions attaching the support substrate to the heat dissipation plate and a plurality of second openings defined therethrough adjacent to the plurality of adhesive portions.

In an embodiment, the fixing portions are disposed directly between the support substrate and the heat dissipation plate.

In an embodiment, the support substrate includes a plurality of first overlap portions that overlaps the fixing portions and a plurality of first non-overlap portions that does not overlap the fixing portions. The heat dissipation plate includes a plurality of second overlap portions that overlaps the fixing portions and a plurality of second non-overlap portions that does not overlap the fixing portions.

In an embodiment, first lateral side edge of the first overlap portions and first lateral side edge of the second overlap portions are substantially parallel to each other in a cross-section.

In an embodiment, the heat dissipation plate and the support substrate are spaced apart from each other with the fixing portions interposed therebetween.

In an embodiment, the support substrate includes a first upper surface and a first lower surface spaced apart from the first upper surface in one direction, the heat dissipation plate includes a second upper surface and a second lower surface spaced apart from the second upper surface in the one direction, and a first height of the support substrate in a direction substantially perpendicular to the first upper surface and the first lower surface is the same as a second height of the heat dissipation plate in a direction substantially perpendicular to the second upper surface and the second lower surface.

In an embodiment, the heat dissipation plate includes one surface adjacent to the support substrate and the other surface spaced apart from the one surface in one direction and mirror-finished.

In an embodiment, the heat dissipation plate includes a plurality of sub-heat dissipation plates, and each of the sub-heat dissipation plates is disposed on the inner side surfaces.

In an embodiment, the heat dissipation plate has an emissivity equal to or smaller than about 0.25.

In an embodiment, the heat dissipation plate includes at least one of Ag, Al, Cu, Cr, and Sn.

In an embodiment, each of the fixing portions has a thickness equal to or greater than about 0.05 mm and equal to or smaller than about 10 mm in a direction substantially perpendicular to the inner side surfaces and a side surface of the heat dissipation plate facing the inner side surfaces.

In an embodiment, the support substrate includes an upper surface and a lower surface spaced apart from the upper surface in one direction, and each of the inner side surfaces is inclined with respect to the upper surface and the lower surface.

In an embodiment, the support substrate includes invar.

In an embodiment, the fixing portions are provided in three or more numbers, and the three or more fixing portions are spaced apart from each other in a cross-section.

In an embodiment, the support substrate and the fixing portions include a same metal material as each other.

According to an embodiment of the present inventive concepts, a deposition apparatus includes a vacuum chamber. A deposition source is disposed in the vacuum chamber. A mask frame is disposed above the deposition source. A mask is disposed on the mask frame. The mask frame includes a support substrate including a plurality of inner side surfaces. The plurality of inner side surfaces defines a first opening through the support substrate. A heat dissipation plate is disposed on the plurality of inner side surfaces. A plurality of fixing portions is disposed between the support substrate and the heat dissipation plate. Each of the fixing portions comprises a plurality of adhesive portions attaching the support substrate to the heat dissipation plate and a plurality of second openings defined therethrough adjacent to the plurality of adhesive portions.

In an embodiment, the heat dissipation plate includes at least one of Ag, Al, Cu, Cr, and Sn, and the heat dissipation plate has an emissivity equal to or smaller than about 0.25.

In an embodiment, the deposition apparatus further includes a magnet disposed on the mask.

According to an embodiment of the present inventive concepts, a mask frame includes a support substrate including a first opening defined therethrough. A heat dissipation plate is disposed on the support substrate. A plurality of fixing portions is disposed directly between the support substrate and the heat dissipation plate. The heat dissipation plate and the support substrate are spaced apart from each other by the plurality of fixing portions to reduce heat transfer from the heat dissipation plate to the support substrate.

In an embodiment, the mask frame includes the heat dissipation plate disposed on the support substrate, and thus, the deformation caused by the heat is reduced.

In an embodiment, the deposition apparatus includes the mask frame in which the heat dissipation plate is disposed on the support substrate, and thus, a deposition accuracy is increased.

BRIEF DESCRIPTION OF THE DRAWINGS

The above and other aspects of the present inventive concepts will become readily apparent by reference to the following detailed description when considered in conjunction with the accompanying drawings wherein.

DETAILED DESCRIPTION OF EMBODIMENTS

Figure 1:
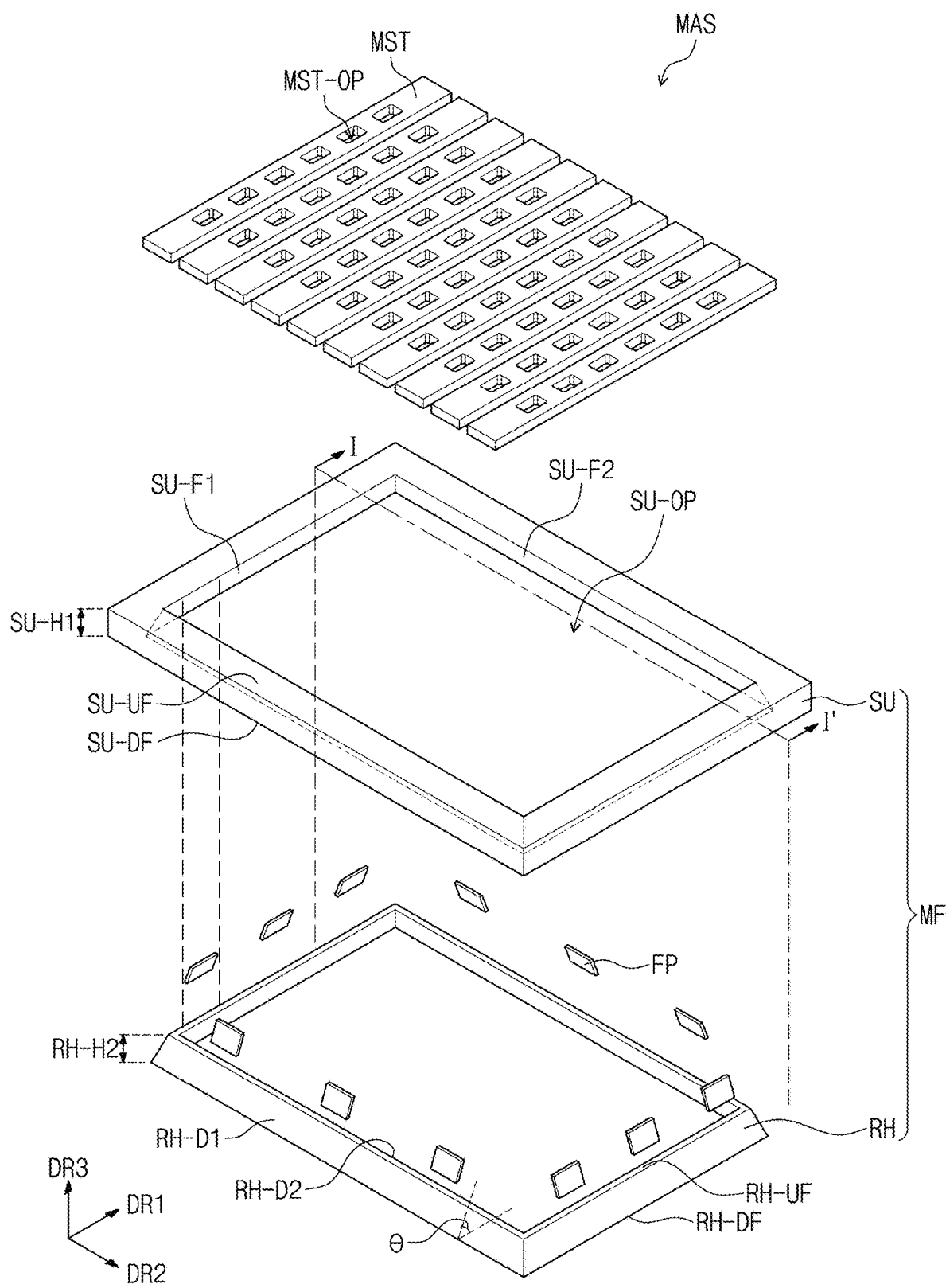
FIG. 1 is an exploded perspective view showing a mask assembly according to an embodiment of the present inventive concepts.

The present inventive concepts may be variously modified and realized in many different forms, and thus specific embodiments will be exemplified in the drawings and described in detail hereinbelow. However, the present inventive concepts are not limited to the specific disclosed embodiments, and the present inventive concepts include all modifications, equivalents, or replacements.

In the present disclosure, it will be understood that when an element or layer is referred to as being "on", "connected to" or "coupled to" another element or layer, it can be directly on, connected to or coupled to the other element or layer or intervening elements or layers may be present. When an element or layer is referred to as being "directly on", "directly connected to" or "directly coupled to" another element or layer, no intervening elements or layers may be present.

Like numerals refer to like elements throughout. In the drawings, the thickness, ratio, and dimension of components may be exaggerated for effective description of the present inventive concepts.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. For example, these terms may only be used to distinguish one element, component, region, layer or section from another region, layer or section. Thus, a first element, component, region, layer or section discussed below could be termed a second element, component, region, layer or section without departing from the teachings of the present inventive concepts. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as shown in the figures.

Unless otherwise defined, all terms including technical and scientific terms used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a mask frame and a deposition apparatus including the mask frame according to an embodiment of the present inventive concepts will be explained in detail with reference to the accompanying drawings.

Figure 2:
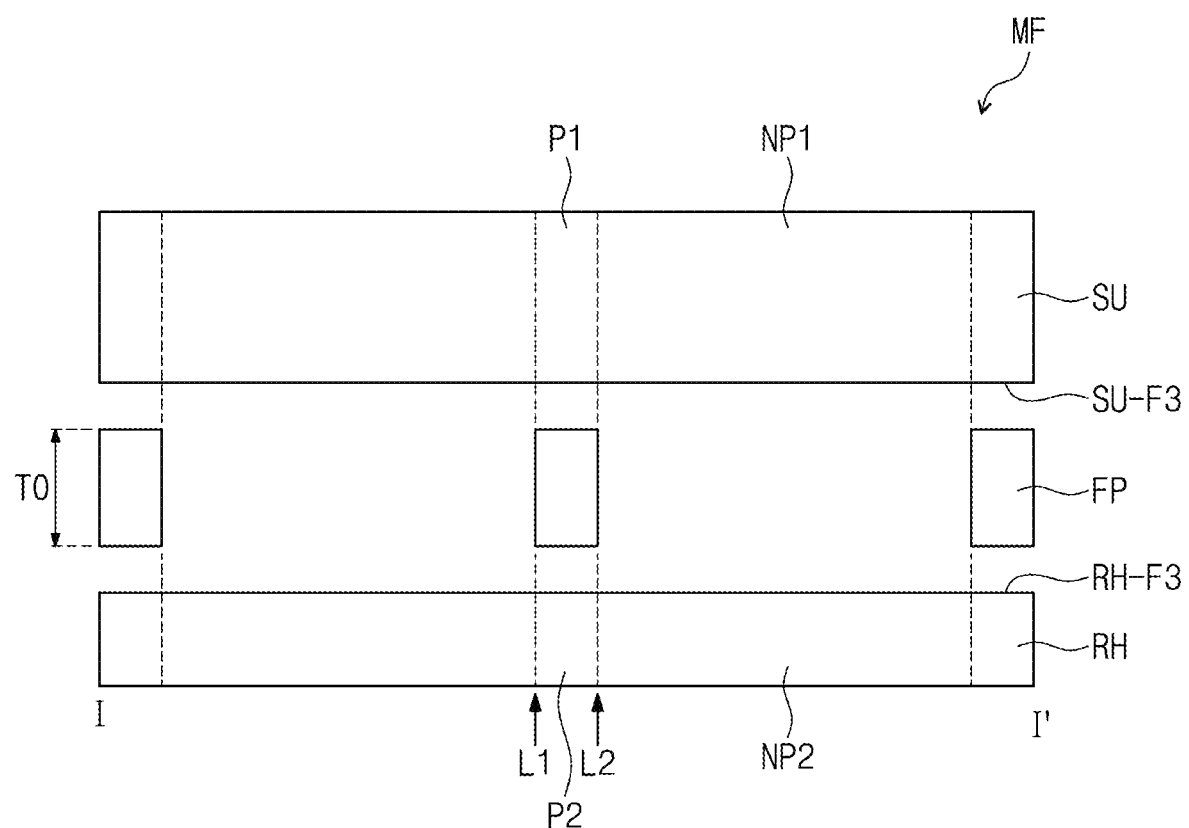
FIG. 2 is a cross-sectional view taken along a line I-I' of FIG. 1 according to an embodiment of the present inventive concepts.
Figure 3:
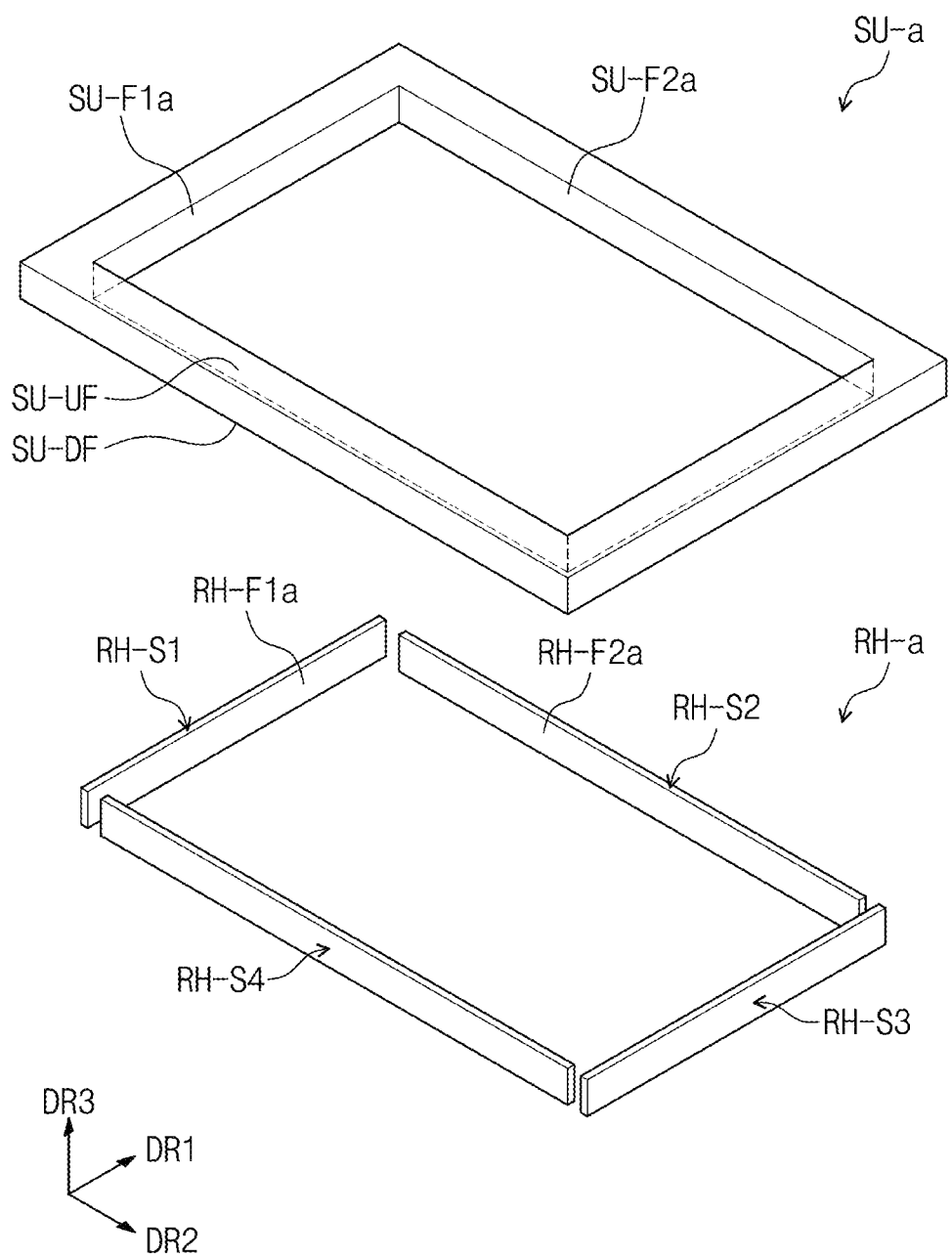
FIG. 3 is an exploded perspective view showing a portion of a mask frame according to an embodiment of the present inventive concepts.
Figure 4:
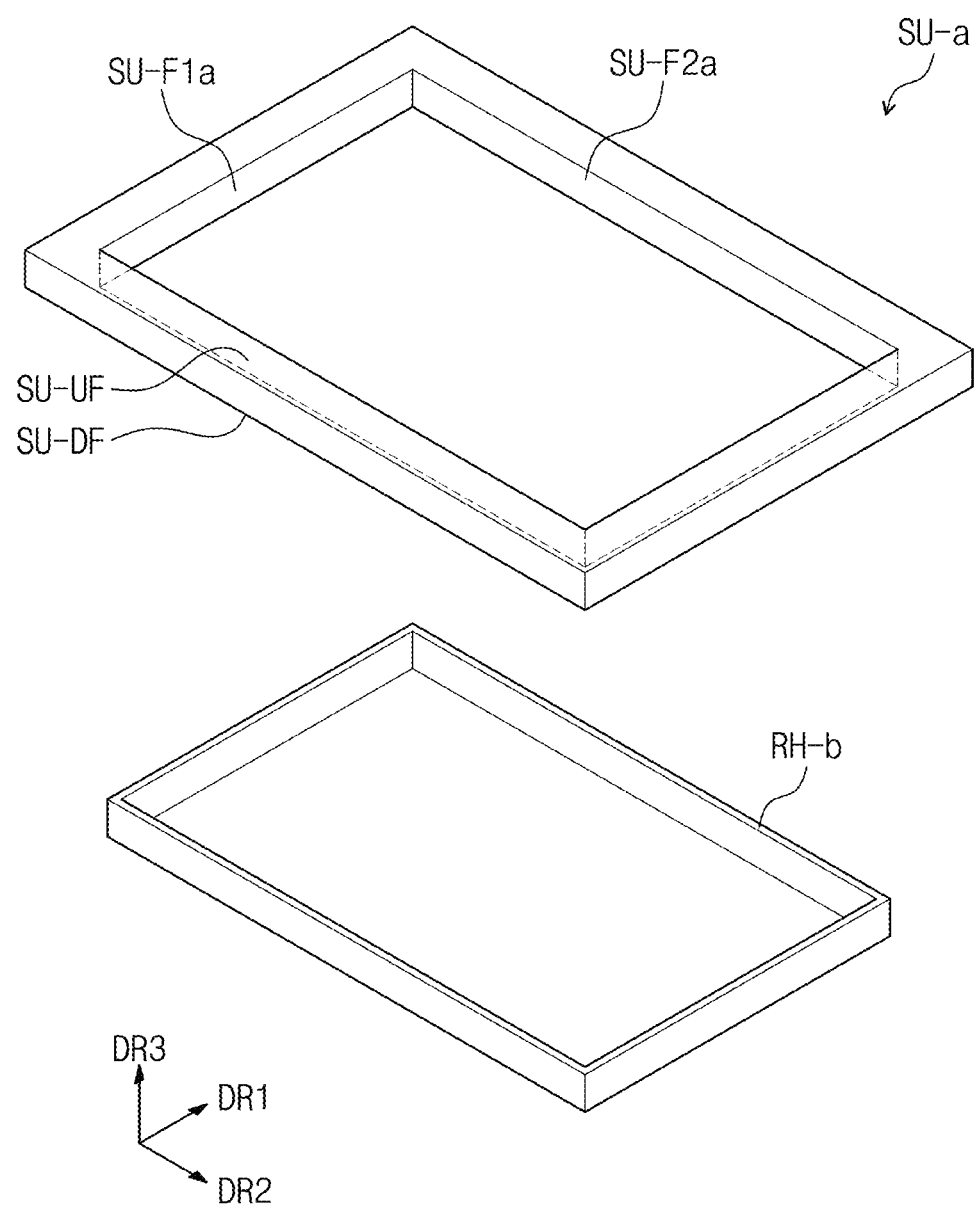
FIG. 4 is an exploded perspective view showing a portion of a mask frame according to an embodiment of the present inventive concepts.
Figure 5:
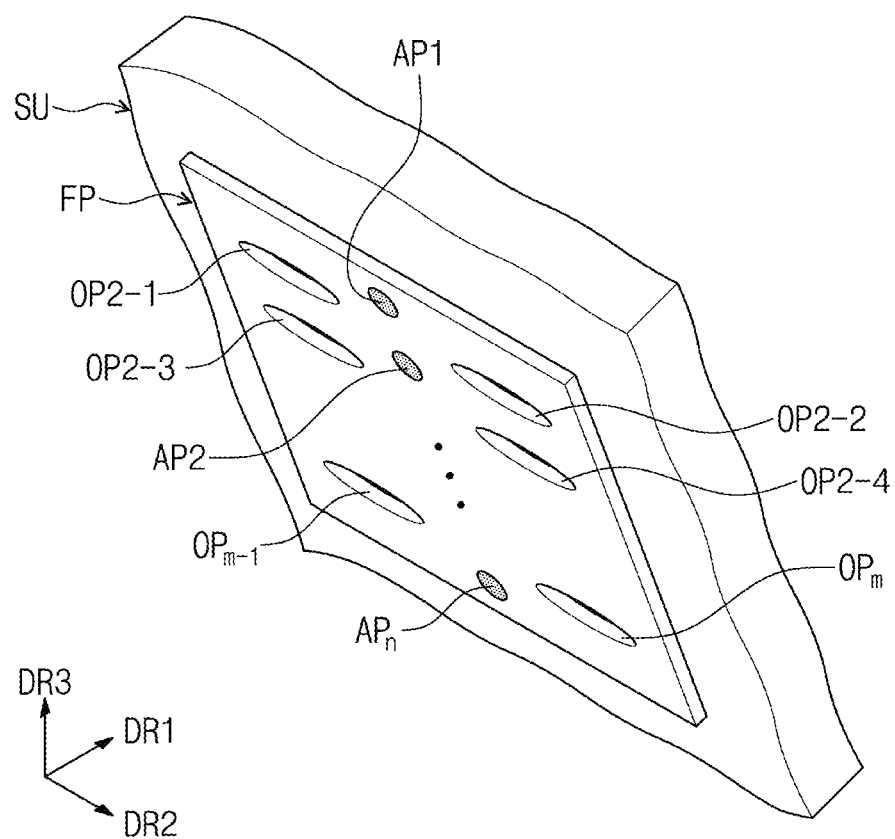
FIG. 5 is a perspective view showing a portion of a mask frame according to an embodiment of the present inventive concepts.

FIG. 1 is an exploded perspective view showing a mask assembly MAS according to an embodiment of the present inventive concepts. FIG. 2 is a cross-sectional view taken along line I-I' of FIG. 1. In detail, FIG. 2 shows the cross-sectional view taken along the line I-I' of FIG. 1 after a mask frame MF of FIG. 1 is assembled. FIGS. 3 and 4 are exploded perspective views showing a portion of a mask frame MF according to an embodiment of the present inventive concepts. FIG. 5 is a perspective view showing a portion of the mask frame MF, such as one of fixing portions FP included in the mask frame MF, according to an embodiment of the present inventive concepts.

Referring to the embodiment of FIG. 1, the mask assembly MAS may include the mask frame MF and a plurality of mask sticks MST disposed on the mask frame MF. The mask frame MF may include a support substrate SU, a heat dissipation plate RH, and a plurality of fixing portions FP disposed between the support substrate SU and the heat dissipation plate RH. The support substrate SU may include a first opening SU-OP defined therethrough by a plurality of inner side surfaces, such as first and second inner side surfaces SU-F1 and SU-F2. The heat dissipation plate RH may be disposed on the first and second inner side surfaces SU-F1 and SU-F2 of the support substrate SU.

The mask sticks MST may be disposed on the mask frame MF. A portion of the mask sticks MST which extend longitudinally substantially parallel to a first direction in which a first directional axis DR1 extends (hereinafter, the "first direction") may be disposed to overlap the mask frame MF. The mask sticks MST may be supported by the mask frame MF. In the present disclosure, the mask sticks MST and a mask MST (refer to FIG. 6) are assigned with the same reference numeral, and the mask sticks MST are described as a representative example of the mask MST (refer to FIG. 6). The mask MST may be used for a deposition process when a display device is manufactured. However, embodiments of the present inventive concepts are not limited thereto and the shape, size and form of the mask MST may vary.

The mask sticks MST may have a rectangular shape in a plane defined by the first directional axis DR1 and a second directional axis DR2. As shown in the embodiment of FIG. 1, the second directional axis DR2 may cross the first directional axis DR1 and the first and second directional axis DR1, DR2, may each extend parallel to a surface of the support substrate SU. Relatively shorter sides of the mask sticks MST having the rectangular shape in the plane may extend longitudinally in a direction that is substantially parallel to the second directional axis DR2 (hereinafter, the "second direction"), and relatively longer sides of the mask sticks MST having the rectangular shape in the plane may extend in the first direction that is substantially parallel to the first directional axis DR1. The mask sticks MST may be arranged in the second directional axis DR2 to be spaced apart from each other. For example, an interval between the mask sticks MST adjacent to each other among the mask sticks may be constant in the second directional axis DR2. However, embodiments of the present inventive concepts are not limited thereto and the arrangement, size and shape of the mask sticks MST may vary.

Each of the mask sticks MST may include a plurality of third openings MST-OP defined therethrough. As shown in the embodiment of FIG. 1, the third openings MST-OP may be arranged along the first direction in one mask stick MST. In an embodiment, an interval between the third openings MST-OP adjacent to each other among the third openings MST-OP may be constant along the first direction. However, embodiments of the present inventive concepts are not limited thereto.

The support substrate SU may be disposed under the mask sticks MST. For example, the support substrate SU may be disposed under the mask sticks MST in a third direction that is parallel to a third directional axis DR3 that is perpendicular to the first and second directions and which may be a thickness direction of the mask frame MF. The support substrate SU may include a metal material. For example, in an embodiment, the support substrate SU may include invar. The invar may be an alloy of iron and nickel. However, embodiments of the present inventive concepts are not limited thereto.

As shown in the embodiment of FIG. 1, the support substrate SU may have a quadrangular ring shape. The support substrate SU may include the first opening SU-OP defined therethrough by the first and second inner side surfaces SU-F1 and SU-F2. The first opening SU-OP may have a quadrangular shape, and the first and second inner side surfaces SU-F1 and SU-F2 of the support substrate SU may have a shape corresponding to four sides of the quadrangular shape. For example, the first opening SU-OP of the support substrate SU may have a rectangular shape. The first and second inner side surfaces SU-F1 and SU-F2 may have a shape corresponding to two relatively shorter sides and two relatively longer sides, respectively, which form the rectangular shape. For example, in an embodiment, the first inner side surfaces SU-F1 may extend longitudinally substantially in the first direction parallel to the first directional axis DR1 and the second inner side surfaces SU-F2 may extend longitudinally substantially in the second direction parallel to the second directional axis DR2. In an embodiment, when viewed in a plane defined by the first directional axis DR1 and the second directional axis DR2, a sum of the areas of the mask sticks MST may be greater than an area of the first opening SU-OP. When viewed in the plane defined by the first directional axis DR1 and the second directional axis DR2, an area of the quadrangular shape defined by the mask sticks MST may be greater than the area of the first opening SU-OP.

The support substrate SU may include a first upper surface SU-UF and a first lower surface SU-DF spaced apart from the first upper surface SU-UF in the third direction in which the third directional axis DR3 extends. As shown in the embodiment of FIG. 1, the first upper surface SU-UF and the first lower surface SU-DF may be substantially parallel to the plane defined by the first directional axis DR1 and the second directional axis DR2. In an embodiment, the first and second inner side surfaces SU-F1 and SU-F2 may be inclined with respect to the first upper surface SU-UF and the first lower surface SU-DF. For example, the first and second inner side surfaces SU-F1 and SU-F2 may be inclined with respect to the plane defined by the first directional axis DR1 and the second directional axis DR2. In an embodiment, the first and second inner side surfaces SU-F1 and SU-F2 and the first lower surface SU-DF may form an acute angle with respect to the plane defined by the first directional axis DR1 and the second directional axis DR2. However, embodiments of the present inventive concepts are not limited thereto and the first and second inner side surfaces SU-F1a and SU-F2a (refer to FIG. 3) of a support substrate SU-a (refer to FIG. 3) may be substantially perpendicular to the plane defined by the first directional axis DR1 and the second directional axis DR2.

The fixing portions FP may be disposed on the support substrate SU. For example, as shown in the embodiment of FIG. 1, the fixing portions FP may be disposed directly on the first and second inner side surfaces SU-F1 and SU-F2 of the support substrate SU. The fixing portions FP may fix the heat dissipation plate RH to the support substrate SU. For example the fixing portions FP may fix the heat dissipation plate RH to the first and second inner side surfaces SU-F1 and SU-F2 of the support substrate SU. In an embodiment, the fixing portions FP may include the same metal material as that of the support substrate SU. For example, the fixing portions FP may include invar.

As shown in the embodiment of FIG. 1, the fixing portions FP may be spaced apart from each other. For example, the fixing portions FP may be disposed on the first and second inner side surfaces SU-F1 and SU-F2 and may be spaced apart from each other at regular intervals. In the embodiment of FIG. 1, three fixing portions FP are disposed on each of the first and second inner side surfaces SU-F1 and SU-F2. However, embodiments of the present inventive concepts are not limited thereto and the number of the fixing portions FP may vary and the spacing of the fixing portions FP may vary. For example, in an embodiment, the number of the fixing portions FP disposed on one inner side surface may be four or more in the mask frame MF. In an embodiment, the four or more fixing portions FP may be spaced apart from each other at regular intervals.

The fixing portions FP may be disposed directly between the support substrate SU and the heat dissipation plate RH. For example, an upper surface and a lower surface of the fixing portions FP may be in direct contact with the support substrate SU and the heat dissipation plate RH, respectively. In an embodiment, portions of the fixing portions FP, which are in direct contact with the support substrate SU and the heat dissipation plate RH, may be one of adhesive portions AP1, AP2, ..., and $AP_n$ (refer to FIG. 5) described later.

The support substrate SU and the heat dissipation plate RH may be spaced apart from each other with the fixing portions FP interposed therebetween. The heat dissipation plate RH may be disposed on the fixing portions FP. For example, the heat dissipation plate RH may be disposed directly on the fixing portions FP. The heat dissipation plate RH may be disposed to correspond to the first and second inner side surfaces SU-F1 and SU-F2 of the support substrate SU. For example, the heat dissipation plate RH may entirely cover the first and second inner side surfaces SU-F1 and SU-F2.

The heat dissipation plate RH may be inclined with respect to the plane defined by the first directional axis DR1 and the second directional axis DR2. For example, first and second side surfaces RH-D1 and RH-D2 of the heat dissipation plate RH may be inclined with respect to the plane defined by the first directional axis DR1 and the second directional axis DR2. As shown in the embodiment of FIG. 1, when viewed in the plane defined by the first directional axis DR1 and the second directional axis DR2, an angle θ between the first and second side surfaces RH-D1 and RH-D2 of the heat dissipation plate RH and the second lower surface RH-DF of the heat dissipation plate RH may be an acute angle. The first and second side surfaces RH-D1 and RH-D2 of the heat dissipation plate RH may be disposed between a second upper surface RH-UF of the heat dissipation plate RH and a second lower surface RH-DF of the heat dissipation plate RH. The second upper surface RH-UF of the heat dissipation plate RH and the second lower surface RH-DF of the heat dissipation plate RH may be spaced apart from each other in the third direction in which the third directional axis DR3 extends. In an embodiment, the second upper surface RH-UF of the heat dissipation plate RH and the second lower surface RH-DF of the heat dissipation plate RH may extend substantially parallel to the plane defined by the first directional axis DR1 and the second directional axis DR2. However, embodiments of the present inventive concepts are not limited thereto.

For example, in an embodiment in which the first and second inner side surfaces SU-F1a and SU-F2a (refer to FIG. 3) of the support substrate SU-a are substantially perpendicular to the plane defined by the first directional axis DR1 and the second directional axis DR2, first and second side surfaces RH-F1a and RH-F2a (refer to FIG. 3) of heat dissipation plates RH-a and RH-b may be substantially perpendicular to the plane defined by the first directional axis DR1 and the second directional axis DR2. A slope of the first and second side surfaces RH-D1, RH-D2, RH-F1a, and RH-F2a of the heat dissipation plates RH, RH-a, and RH-b with respect to the plane defined by the first directional axis DR1 and the second directional axis DR2 may be changed to correspond to the slope of the first and second inner side surfaces SU-F1, SU-F2, SU-F1a, and SU-F2a with respect to the plane defined by the first directional axis DR1 and the second directional axis DR2.

In an embodiment of the present inventive concepts, a second height RH-H2 of the heat dissipation plate RH may be substantially the same as a first height SU-H1 of the support substrate SU. The first height SU-H1 of the support substrate SU may be measured in a direction substantially perpendicular to the first upper surface SU-UF and the first lower surface SU-DF. The second height RH-H2 of the heat dissipation plate RH may be measured in a direction substantially perpendicular to the second upper surface RH-UF and the second lower surface RH-DF of the heat dissipation plate RH. The second height RH-H2 of the heat dissipation plate RH and the first height SU-H1 of the support substrate SU may be measured in a direction substantially perpendicular to the plane defined by the first directional axis DR1 and the second directional axis DR2. For example, the second height RH-H2 of the heat dissipation plate RH and the first height SU-H1 of the support substrate SU may be lengths in the third direction substantially parallel to the third directional axis DR3.

The heat dissipation plate RH may include a metal material. For example, in an embodiment, the heat dissipation plate RH may include at least one compound selected from Ag, Al, Cu, Cr, and Sn. In an embodiment, the heat dissipation plate RH may have an emissivity that is less than or equal to about 0.25. In an embodiment, the emissivity of the heat dissipation plate RH may be less than an emissivity of a stainless steel. In an embodiment, stainless steel may be included in a deposition apparatus EV (refer to FIG. 6) in which a vacuum chamber CB (refer to FIG. 6) is installed. As an example, the emissivity of the heat dissipation plate RH may be less than or equal to about 0.20. However, embodiments of the present inventive concepts are not limited thereto and the emissivity of the heat dissipation plate RH may vary.

Objects with high emissivity may have a high energy absorption rate and a low energy reflectance. Objects with low emissivity may have a low energy absorption rate and a high energy reflectance. In an embodiment in which the heat dissipation plate RH has the relatively low emissivity that is less than or equal to about 0.25, the energy absorption rate may decrease, and the energy reflectance may increase.

As described above, the heat dissipation plate RH and the support substrate SU may be spaced apart from each other by the fixing portions FP. In an embodiment, each of the fixing portions FP may have a thickness TO that is in a range of about 0.05 mm to about 10 mm. For example, the thickness TO of each of the fixing portions FP may be in a range of about 0.1 mm to about 10 mm. As shown in the embodiment of FIG. 2, the thickness TO of each of the fixing portions FP may be measured in a direction substantially perpendicular to a third surface SU-F3 of the support substrate SU and a third surface RH-F3 of the heat dissipation plate RH. In an embodiment, the third surface SU-F3 of the support substrate SU may be one of the first and second inner side surfaces SU-F1 and SU-F2 (refer to FIG. 1) of the support substrate SU. The third surface RH-F3 of the heat dissipation plate RH may be the first side surface RH-D1 (refer to FIG. 1) of the heat dissipation plate RH facing the support substrate SU.

The third surface SU-F3 of the support substrate SU and the third surface RH-F3 of the heat dissipation plate RH may face each other. When the thickness of the fixing portions FP is within the above-described thickness ranges, the heat dissipation plate RH may be spaced apart from the support substrate SU, and a heat transferred from the heat dissipation plate RH to the support substrate SU may be reduced or prevented. Accordingly, a deformation of the support substrate SU due to the heat may be reduced or prevented.

FIG. 2 shows a structure in which three fixing portions FP are spaced apart from each other in a cross-section. As shown in the embodiment of FIG. 2, among the three fixing portions FP, two fixing portions FP may be disposed adjacent to a first lateral side and the opposite second lateral side of the support substrate SU, respectively, and the remaining one fixing portion FP among the three fixing portions FP may be disposed to be spaced apart from the two fixing portions FP at regular intervals. In an embodiment, the first lateral side and the opposite second lateral side of the support substrate SU may extend in the first direction that is substantially parallel to the first directional axis DR1, and the first lateral side and the opposite second lateral side of the support substrate SU may be spaced apart from each other in the second direction parallel to the second directional axis DR2.

As shown in the embodiment of FIG. 2, the support substrate SU may include a plurality of first overlap portions P1 that overlaps the fixing portions FP and a plurality of first non-overlap portions NP1 that does not overlap the fixing portions FP. The first overlap portions P1 may be alternately arranged with the first non-overlap portions NP1. The heat dissipation plate RH may include a plurality of second overlap portions P2 that overlaps the fixing portions FP and a plurality of second non-overlap portions NP2 that does not overlap the fixing portions FP. The second overlap portions P2 may be alternately arranged with the second non-overlap portions NP2. When viewed in a cross-section, lateral side edges of the first overlap portions P1 and lateral side edges of the second overlap portions P2 may be substantially parallel to each other. The lateral side edges of the first overlap portions P1 and the lateral side edges of the second overlap portions P2 may be substantially parallel to lines "L1" and "L2" shown in FIG. 2. For example, in FIG. 2, "L1" and "L2" indicate imaginary lines extending respectively from the a first lateral side edge of the first overlap portions P1 and the opposite second lateral side edge of the first overlap portions P1. Also, "L1" and "L2" may be imaginary lines extending respectively from a first lateral side edge of the second overlap portions P2 and the opposite second lateral side edge of the second overlap portions P2.

FIGS. 3 and 4 are perspective views showing a mask frame MF according to embodiments of the present inventive concepts and show a portion of the mask frame MF. In FIGS. 3 and 4, fixing portions FP are omitted for convenience of explanation, and the support substrate SU-a and the heat dissipation plates RH-a and RH-b are shown. Descriptions of the fixing portions FP described with reference to the embodiments of FIGS. 1 and 2 may be applied to the fixing portions in FIGS. 3 and 4 and a repeated description thereof will be omitted for convenience of explanation.

Different from FIG. 1, in the embodiments of FIGS. 3-4, the first and second inner side surfaces SU-F1a and SU-F2a of the support substrate SU-a are shown to be substantially perpendicular to a first upper surface SU-UF and a first lower surface SU-DF of the support substrate SU-a. The first and second inner side surfaces SU-F1a and SU-F2a of the support substrate SU-a may not be inclined with respect to the first upper surface SU-UF and the first lower surface SU-DF of the support substrate SU-a. For example, the first and second inner side surfaces SU-F1a and SU-F2a may be substantially perpendicular to the first upper surface SU-UF and the first lower surface SU-DF, and the first and second side surfaces RH-F1a and RH-F2a of the heat dissipation plates RH-a and RH-b may be substantially perpendicular to the first upper surface SU-UF and the first lower surface SU-DF of the support substrate SU-a. In an embodiment, the first and second inner side surfaces SU-F1a and SU-F2a of the support substrate SU-a and the first and second side surfaces RH-F1a and RH-F2a of the heat dissipation plates RH-a and RH-b may extend substantially in the third direction that is parallel to the third directional axis DR3.

As shown in the embodiment of FIG. 3, the heat dissipation plate RH-a may include a plurality of sub-heat dissipation plates, such as first to fourth sub-heat dissipation plates RH-S1, RH-S2, RH-S3, and RH-S4. The first to fourth sub-heat dissipation plates RH-S1, RH-S2, RH-S3, and RH-S4 may be disposed on the first and second inner side surfaces SU-F1a and SU-F2a of the support substrate SU-a, respectively. One sub-heat dissipation plate may be disposed on one inner side surface SU-F2a. In an embodiment, each of the sub-heat dissipation plates may be spaced apart from each other. However, embodiments of the present inventive concepts are not limited thereto.

For example, as shown in the embodiment of FIG. 4, the heat dissipation plate RH-b may have an integral shape corresponding to the first and second inner side surfaces SU-F1a and SU-F2a of a support substrate SU-a. FIG. 4 shows the heat dissipation plate RH-b having sides that extend in the third direction that is substantially parallel to the third directional axis DR3. For example, the heat dissipation plate RH-b shown in the embodiment of FIG. 4 may not include an inclined surface. In an embodiment in which the first and second inner side surfaces SU-F1a and SU-F2a of the support substrate SU-a are substantially perpendicular to the first upper surface SU-UF and the first lower surface SU-DF of the support substrate SU-a, the heat dissipation plate RH-b may not include the inclined surface.

FIG. 5 is a perspective view showing a fixing portion FP according to an embodiment of the present inventive concepts. The fixing portion FP may include the adhesive portions $AP1$, $AP2$, . . . , and $AP_n$ that fix the support substrate SU to the heat dissipation plate RH. In an embodiment, the adhesive portions $AP1$, $AP2$, . . . , and $AP_n$ may be portions welded by a laser beam. The support substrate SU and the heat dissipation plate RH may be attached to the fixing portion FP by a laser welding process. However, embodiments of the present inventive concepts are not limited thereto, and a method of attaching the support substrate SU and the heat dissipation plate RH to the fixing portion FP may vary.

In addition, the fixing portion FP may be provided with a plurality of second openings OP2-1, OP2-2, OP2-3, OP2-4, . . . , $OP_{m-1}$, and $OP_m$ defined therethrough and are positioned adjacent to the adhesive portions $AP1$, $AP2$, . . . , and $AP_n$. In an embodiment, the second openings OP2-1, OP2-2, OP2-3, OP2-4, . . . , $OP_{m-1}$, and $OP_m$ may be spaced apart from each other at regular intervals. For example, among the second openings OP2-1, OP2-2, OP2-3, OP2-4, . . . , $OP_{m-1}$, and $OP_m$, the interval between the second openings OP2-1, OP2-2, OP2-3, OP2-4, ..., OP$_{m-1}$, and OP$_m$ adjacent to each other in one direction may be constant. However, embodiments of the present inventive concepts are not limited thereto. For example, among the second openings OP2-1, OP2-2, OP2-3, OP2-4, ..., OP$_{m-1}$, and OP$_m$, the interval between the second openings OP2-1, OP2-2, OP2-3, OP2-4, ..., OP$_{m-1}$, and OP$_m$ adjacent to each other in one direction may not be constant.

In addition, the second openings OP2-1, OP2-2, OP2-3, OP2-4, ..., OP$_{m-1}$, and OP$_m$ may have a circular shape in a plane as shown in FIG. 5. For example, the second openings OP2-1, OP2-2, OP2-3, OP2-4, ..., OP$_{m-1}$, and OP$_m$ may have an elongated oval shape. However, embodiments of the present inventive concepts are not limited thereto. For example, the shape of the second openings OP2-1, OP2-2, OP2-3, OP2-4, ..., OP$_{m-1}$, and OP$_m$ may vary and should not be limited to the circular shape. Positions of the second openings OP2-1, OP2-2, OP2-3, OP2-4, ..., OP$_{m-1}$, and OP$_m$ should not be limited to positions shown in the embodiment of FIG. 5 and the arrangement of the second openings OP2-1, OP2-2, OP2-3, OP2-4, ..., OP$_{m-1}$, and OP$_m$ may vary.

The second openings OP2-1, OP2-2, OP2-3, OP2-4, ..., OP$_{m-1}$, OP$_m$ may prevent accumulation of foreign matter. After the deposition process in the deposition apparatus EV according to an embodiment to be described later, a cleaning process may be performed, and a material used in the cleaning process may pass through the second openings OP2-1, OP2-2, OP2-3, OP2-4, ..., OP$_{m-1}$, OP$_m$. Accordingly, it is possible to prevent foreign matter from accumulating between the support substrate SU and the heat dissipation plate RH.

The fixing portions FP may prevent the support substrate SU from making direct contact with the heat dissipation plate RH. For example, the support substrate SU may be spaced apart from the heat dissipation plate RH by the fixing portions FP. Since the support substrate SU is spaced apart from the heat dissipation plate RH, the heat absorbed by the heat dissipation plate RH may be prevented from being transferred to the support substrate SU.

The mask frame MF may be a structure to fix the mask sticks MST. The mask sticks MST may be used in the deposition process, and materials may be deposited through the third openings MST-OP of the mask sticks MST. In an embodiment, a base substrate BS (refer to FIG. 6) on which the deposition process is performed may be disposed above the mask sticks MST.

In a comparative embodiment in which the mask frame does not include the heat dissipation plate, the support substrate absorbs the heat. In the support substrate absorbing the heat, a deformation such as a thermal expansion occurs. As the support substrate is deformed, the deformed support substrate alters the position of the mask sticks arranged above the support substrate, and a pixel position accuracy (PPA) is degraded. In an embodiment the mask frame MF may include the heat dissipation plates RH, RH-a, and RH-b disposed on the support substrates SU and SU-a and the fixing portions FP disposed between the support substrates SU and SU-a and the heat dissipation plates RH, RH-a, and RH-b. Accordingly, the deformation of the support substrates SU and SU-a due to the heat transferred thereto may be reduced or prevented, and the pixel position accuracy of the mask frame MF may be increased.

Hereinafter, the deposition apparatus EV according to embodiments of the present inventive concepts will be described in detail with reference to FIGS. 6 to 8. In descriptions of the deposition apparatus EV, repetitive descriptions of elements of the mask frame MF described with reference to FIGS. 1 to 5 will be omitted for convenience of explanation, and descriptions will be focused on different features.

Figure 6:
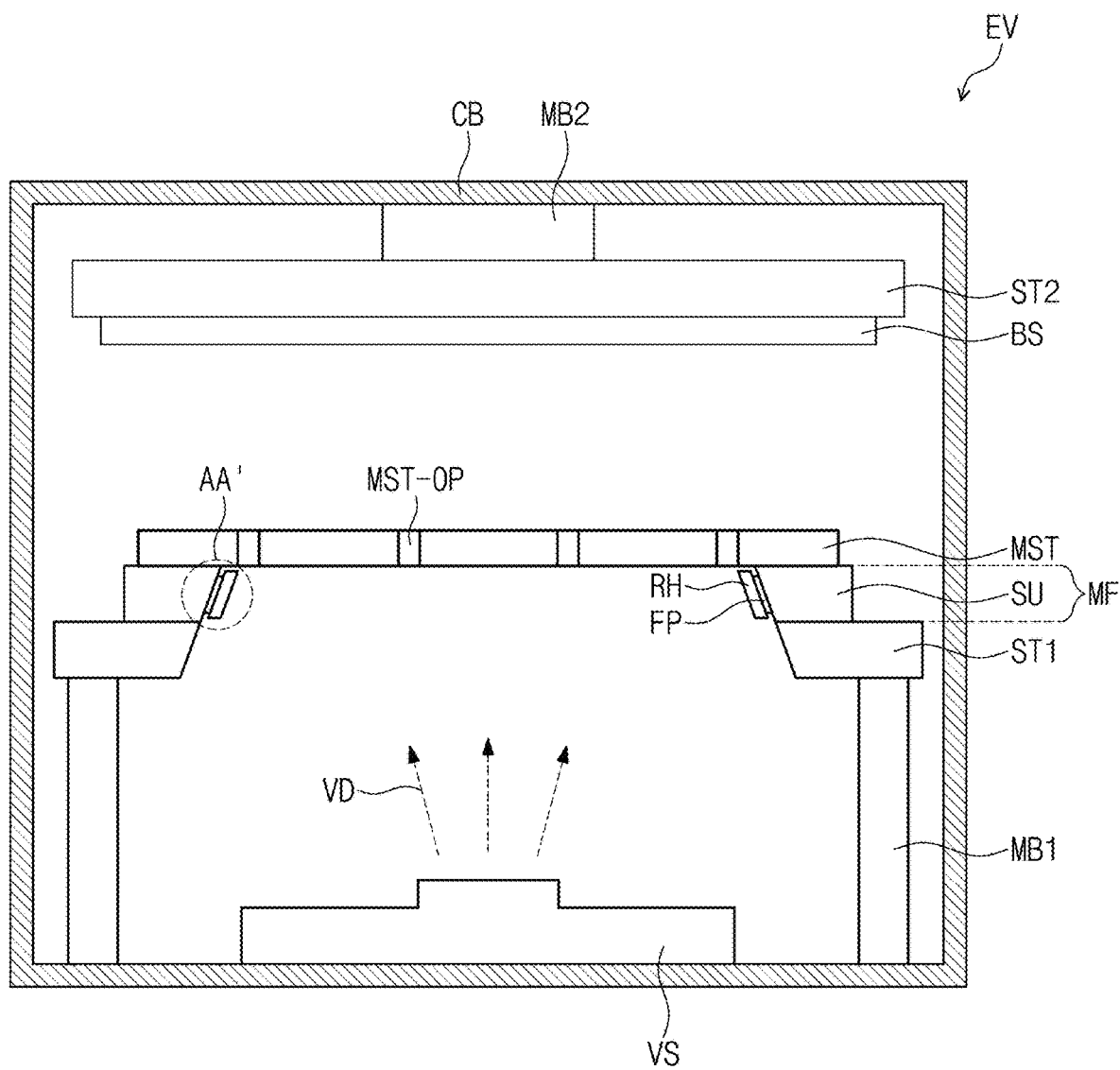
FIG. 6 is a cross-sectional view showing a deposition apparatus according to an embodiment of the present inventive concepts.

FIG. 6 is a cross-sectional view showing the deposition apparatus EV according to an embodiment of the present inventive concepts. FIG. 7 is an enlarged cross-sectional view showing an area AA' of FIG. 6. FIG. 8 is a cross-sectional view showing a portion of a pixel PX formed by the deposition apparatus EV shown in FIG. 6.

As shown in the embodiment of FIG. 6, the deposition apparatus EV may include a vacuum chamber CB, a deposition source VS, the mask frame MF, and the mask MST, and the deposition source VS, the mask frame MF, and the mask MST may be disposed in the vacuum chamber CB. The mask frame MF may be disposed above the deposition source VS. The mask MST may be disposed above the mask frame MF. In an embodiment, the above-described mask stick MST (refer to FIG. 1) may be the same as the mask MST.

The mask frame MF may include the support substrate SU, the heat dissipation plate RH, and the fixing portions FP. The support substrate SU may include the first opening SU-OP (refer to FIG. 1) defined by the first and second inner side surfaces SU-F1 and SU-F2 (refer to FIG. 1). The heat dissipation plate RH may be disposed on the first and second inner side surfaces SU-F1 and SU-F2 (refer to FIG. 1) of the support substrate SU. The fixing portions FP may be disposed directly on the first and second inner side surfaces SU-F1 and SU-F2 (refer to FIG. 1) of the support substrate SU. The fixing portions FP may be disposed between the heat dissipation plate RH and the first and second inner side surfaces SU-F1 and SU-F2 (refer to FIG. 1) of the support substrate SU. Each of the fixing portions FP may include the adhesive portions AP1, AP2, ..., and AP$_n$ (refer to FIG. 5) to attach the support substrate SU to the heat dissipation plate RH. In addition, the fixing portions FP may include the second openings OP2-1, OP2-2, OP2-3, OP2-4, ..., OP$_{m-1}$, and OP$_m$ (refer to FIG. 5) defined adjacent to the adhesive portions AP1, AP2, ..., and AP$_n$.

Referring to the embodiment of FIG. 6, the deposition apparatus EV may include a first stage ST1, a second stage ST2, a first member MB1, and a second member MB2. The first stage ST1, the second stage ST2, the first member MB1, and the second member MB2 may be disposed in the vacuum chamber CB. The vacuum chamber CB may be maintained in a vacuum state.

The mask frame MF may be disposed on the first stage ST1. For example, as shown in the embodiment of FIG. 6, the support substrate SU may be disposed directly on the first stage ST1. An upper surface of the first stage ST1 may directly contact a lower surface of the support substrate SU. The first stage ST1 may be supported by the first member MB1. The first member MB1 may be disposed under the first stage ST1.

The base substrate BS may be disposed directly on a lower surface of the second stage ST2. The second stage ST2 may be a member on which the base substrate BS is disposed. The base substrate BS may be fixed to the second stage ST2. The second member MB2 may be disposed on the second stage ST2. For example, in an embodiment, the second member MB2 may be a magnet. The second member MB2 may fix the second stage ST2.

The deposition apparatus EV may be used to deposit a deposition material VD on the base substrate BS. The base substrate BS may be disposed above the mask MST. As shown in the embodiment of FIG. 6, the base substrate BS may have a single-layer structure. However, embodiments of the present inventive concepts are not limited thereto. For example, the base substrate BS may have a multi-layer structure of a plurality of layers. In an embodiment, an organic material may be deposited on the base substrate BS. As described above, the deposition material VD may be deposited on a first surface of the base substrate BS after passing through the third openings MST-OP of the mask MST. The first surface of the base substrate BS may not be in contact with the second stage ST2. For example, as shown in the embodiment of FIG. 6, the first surface may be a bottom surface of the base substrate BS and the upper surface of the base substrate BS may directly contact the second stage ST2.

The deposition source VS may include the deposition material VD. In an embodiment, the deposition material VD may be heated in the deposition source VS and sprayed upward. The deposition material VD may be sprayed toward the base substrate BS. A heat radiation energy EA (refer to FIG. 7) may be generated in the deposition source VS. Since the vacuum chamber CB is in the vacuum state, there is no heat transfer by convection, and the heat radiation energy EA generated by the deposition source VS may be absorbed or reflected by the mask frame MF after moving upward.

Figure 7:
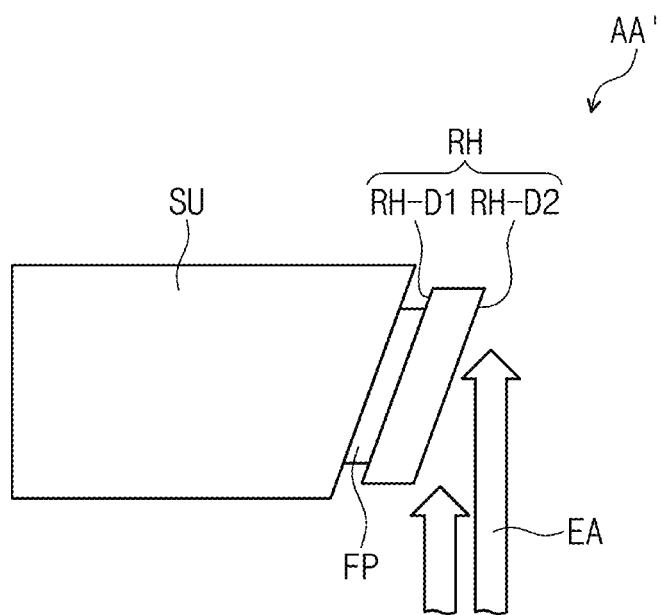
FIG. 7 is an enlarged cross-sectional view showing an area AA of FIG. 6 according to an embodiment of the present inventive concepts.

Referring to the embodiment of FIG. 7, the heat dissipation plate RH may include a first surface and an opposite second surface, such as the first side surface RH-D1 and the second side surface RH-D2.

The second side surface RH-D2 of the heat dissipation plate RH and the first side surface RH-D1 of the heat dissipation plate RH may be spaced apart from each other in one direction. The first side surface RH-D1 of the heat dissipation plate RH may be disposed adjacent to the support substrate SU. For example, the first side surface RH-D1 of the heat dissipation plate RH may be in direct contact with the fixing portion FP. The second side surface RH-D2 of the heat dissipation plate RH may be exposed to the deposition source VS. The second side surface RH-D2 of the heat dissipation plate RH exposed to the deposition source VS may be exposed to the heat radiation energy EA. In an embodiment, the second side surface RH-D2 of the heat dissipation plate RH exposed to the deposition source VS may be mirror-finished. When compared with a heat dissipation plate that is not mirror-finished, a reflectance of energy may be increased in the heat dissipation plate RH that is mirror-finished. As the energy reflectance increases in the second side surface RH-D2 of the heat dissipation plate RH, an energy absorption rate may be reduced.

The mask frame including the support substrate in which the heat dissipation plate is not disposed may be deformed due to the heat radiation energy. As the support substrate is deformed by the heat radiation energy, the pixel position accuracy of the mask disposed on the support substrate may be degraded. When the pixel position accuracy of the mask is degraded, a deposition accuracy may decrease in the deposition process.

The mask frame MF may include the heat dissipation plate RH disposed on the support substrate SU. As the heat dissipation plate RH is disposed on the support substrate SU, a direct exposure of the support substrate SU to the heat radiation energy may be reduced. In an embodiment, the heat dissipation plate RH may include at least one compound selected from Ag, Al, Cu, Cr, and Sn, and the emissivity of the heat dissipation plate RH may be less than or equal to about 0.25. Accordingly, an amount of the heat transferred from the heat dissipation plate RH to the support substrate SU may be reduced. The heat dissipation plate RH having an emissivity that is lower than that of the material, such as stainless steel, in the vacuum chamber CB, may have a relatively low absorption rate of the heat radiation energy and a relatively high reflectance of the heat radiation energy.

In addition, in an embodiment in which the second side surface RH-D2 of the heat dissipation plate RH exposed to the deposition source VS is mirror-finished, the absorption rate of the heat radiation energy may be reduced. As the absorption rate of the heat radiation energy in the heat dissipation plate RH is reduced, the amount of the heat transferred to the support substrate SU from the heat dissipation plate RH may be reduced. Accordingly, the deformation caused by the heat in the mask frame MF may be reduced or prevented, and the deposition accuracy in the deposition apparatus EV including the mask frame MF may be increased.

Meanwhile, a plurality of metal sticks may be disposed under the mask MST. In addition, each of the metal sticks may be provide with a plurality of openings defined therethrough.

Figure 8:
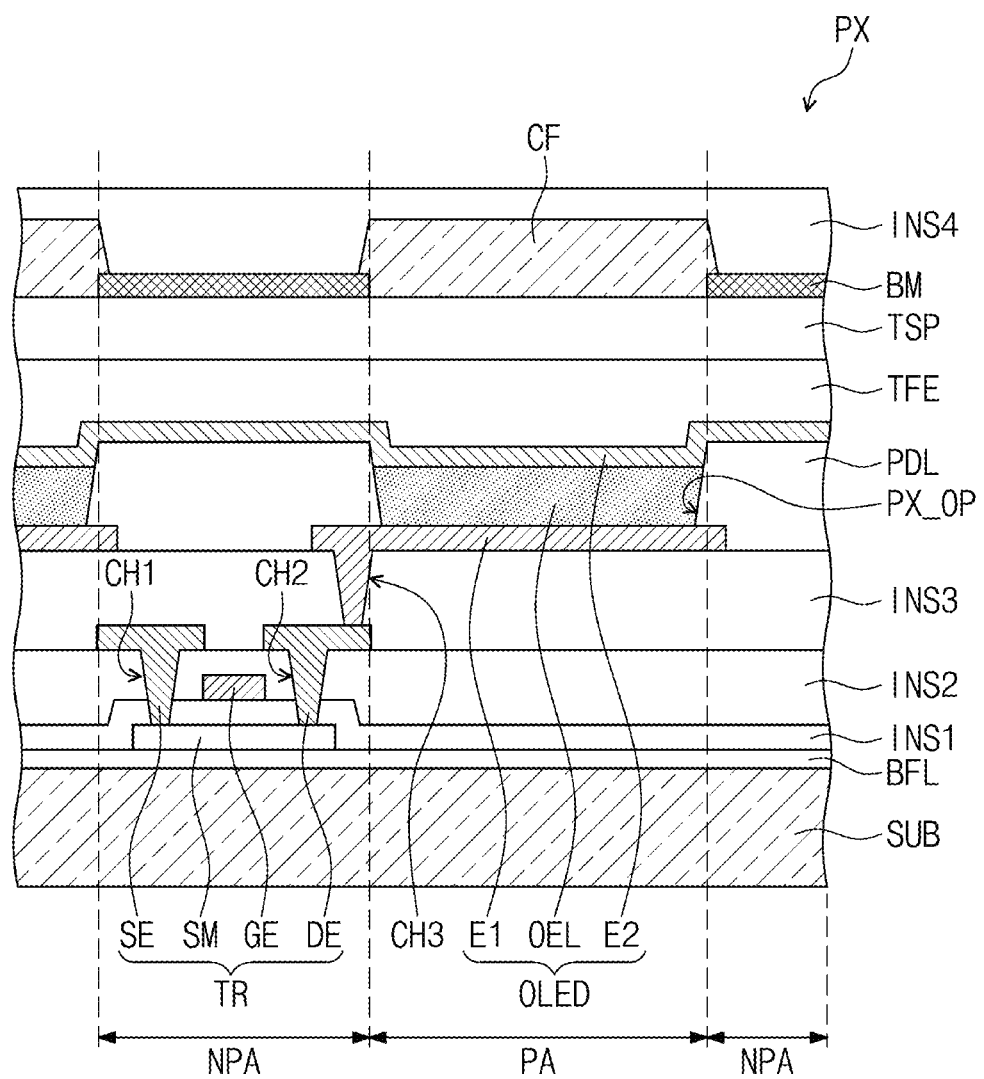
FIG. 8 is a cross-sectional view showing a portion of a pixel formed by the deposition apparatus shown in FIG. 6 according to an embodiment of the present inventive concepts.

FIG. 8 is a cross-sectional view showing a pixel PX including a color filter CF formed by the deposition apparatus EV according to an embodiment of the present inventive concepts. As shown in the embodiment of FIG. 8, the pixel PX may include a light emitting element OLED, a transistor TR connected to the light emitting element OLED, and the color filter CF disposed on the light emitting element OLED.

The light emitting element OLED may include a first electrode E1, a second electrode E2, and a light emitting layer OEL disposed between the first electrode E1 and the second electrode E2 (e.g., in a thickness direction of the base layer SUB). The light emitting element OLED may be an organic light emitting element. In an embodiment, the light emitting layer OEL may be an organic light emitting layer.

In an embodiment, the first electrode E1 may be an anode electrode, and the second electrode E2 may be a cathode electrode. The first electrode E1 may be a pixel electrode, and the second electrode E2 may be a common electrode.

The pixel PX may include a pixel area PA and a non-pixel area NPA adjacent to the pixel area PA. The light emitting element OLED may be disposed in the pixel area PA, and the transistor TR may be disposed in the non-pixel area NPA.

The transistor TR and the light emitting element OLED may be disposed on a base layer SUB. A buffer layer BFL may be disposed on the base layer SUB. In an embodiment, the buffer layer BFL may include an inorganic material.

A semiconductor layer SM of the transistor TR may be disposed on the buffer layer BFL. In an embodiment, the semiconductor layer SM may include an inorganic semiconductor including amorphous silicon or polycrystalline silicon or an organic semiconductor. In addition, the semiconductor layer SM may include an oxide semiconductor. The semiconductor layer SM may include a source area, a drain area, and a channel area defined between the source area and the drain area.

A first insulating layer INS1 may be disposed on the buffer layer BFL to cover the semiconductor layer SM. In an embodiment, the first insulating layer INS1 may include an inorganic material. A gate electrode GE of the transistor TR may be disposed on the first insulating layer INS1 to overlap the semiconductor layer SM. The gate electrode GE may be disposed to overlap the channel area of the semiconductor layer SM.

A second insulating layer INS2 may be disposed on the first insulating layer INS1 to cover the gate electrode GE.

The second insulating layer INS2 may include an organic material and/or an inorganic material.

A source SE and a drain DE of the transistor TR may be disposed on the second insulating layer INS2 to be spaced apart from each other. As shown in the embodiment of FIG. 8, the source SE may be connected to the source area of the semiconductor layer SM via a first contact hole CH1 defined through the first insulating layer INS1 and the second insulating layer INS2. The drain DE may be connected to the drain area of the semiconductor layer SM via a second contact hole CH2 defined through the first insulating layer INS1 and the second insulating layer INS2.

A third insulating layer INS3 may be disposed on the second insulating layer INS2 to cover the source SE and the drain DE of the transistor TR. In an embodiment, the third insulating layer INS3 may include an organic material.

The first electrode E1 may be disposed on the third insulating layer INS3. The first electrode E1 may be connected to the drain DE of the transistor TR via a third contact hole CH3 defined through the third insulating layer INS3.

A pixel definition layer PDL may be disposed on the first electrode E1 and the third insulating layer INS3 to expose a predetermined portion of the first electrode E1. For example, as shown in the embodiment of FIG. 8, the pixel definition layer PDL may be disposed on lateral edges of the first electrode E1 and may expose a central portion of the first electrode E1. The pixel definition layer PDL may include an opening PX_OP defined therethrough to expose the predetermined portion of the first electrode E1.

The light emitting layer OEL may be disposed on the first electrode E1 in the opening PX_OP. In an embodiment, the light emitting layer OEL may generate a light having a red, green, or blue color. In addition, the light emitting layer OEL may generate a white light by combining organic materials respectively generating red, green, and blue colors. However, embodiments of the present inventive concepts are not limited thereto and the colors of the light emitting layer OEL may vary. The light emitting layer OEL may include an organic light emitting material. However, embodiments of the present inventive concepts are not limited thereto or thereby. For example, the light emitting layer may include a quantum dot or a quantum rod.

The second electrode E2 may be disposed on the pixel definition layer PDL and the light emitting layer OEL. A thin film encapsulation layer TFE may be disposed on the second electrode E2. Holes and electrons injected into the light emitting layer OEL may be recombined to generate excitons, and the light emitting element OLED may emit the light by the excitons that return to a ground state from an excited state. The light emitting element OLED may emit red, green, and blue lights depending on a flow of current, and thus, may display an image.

As shown in the embodiment of FIG. 8, a touch sensing unit TSP may be disposed on the thin film encapsulation layer TFE. The touch sensing unit TSP may sense an external input, such as a user's touch, etc., may convert the external input to a predetermined input signal, and may apply the input signal to a display panel including the pixels PX. The touch sensing unit TSP may include a plurality of touch sensor portions to sense the external input. In an embodiment, the touch sensor portions may sense the external input by a capacitance method.

The color filter CF and a black matrix BM may be disposed on the touch sensing unit TSP. The color filter CF may overlap the pixel area PA, and the black matrix BM may overlap the non-pixel area NPA.

In an embodiment, the color filter CF may have one of the red, green, and blue colors. The color filter CF may convert the light incident thereto to the light having one of the red, green, and blue colors. In an embodiment, the color filter CF may be formed by the deposition apparatus EV. The base substrate BS shown in the embodiment of FIG. 6 may be the base layer SUB shown in the embodiment of FIG. 8. The color filter CF may be formed on the base layer SUB. However, embodiments of the present inventive concepts are not limited thereto. For example, the base substrate BS shown in the embodiment of FIG. 6 may include the base layer SUB, components stacked between the base layer SUB and the touch sensing unit TSP, and the touch sensing unit TSP. However, the configuration of the base substrate BS may vary and should not be limited thereto or thereby.

A fourth insulating layer INS4 may be disposed on the color filter CF and the black matrix BM. In an embodiment, a protective layer may be disposed on the fourth insulating layer INS4.

The deposition apparatus EV may include the vacuum chamber CB, the deposition source VS, the mask frame MF, and the mask MST, and the deposition source VS, the mask frame MF, and the mask MST may be disposed in the vacuum chamber CB. The mask frame MF may include the support substrate SU, the heat dissipation plate RH, and the fixing portions FP disposed between the support substrate SU and the heat dissipation plate RH. As the heat dissipation plate RH is disposed on the support substrate SU, the absorption of the heat radiation energy EA, which is generated from the deposition source VS, by the support substrate SU may be reduced. In addition, since the support substrate SU and the heat dissipation plate RH are spaced apart from each other with the fixing portion FP interposed therebetween, the heat transferred to the support substrate SU from the heat dissipation plate RH may be reduced. Accordingly, the deposition accuracy of the deposition apparatus EV may be increased.

Figure 9A:
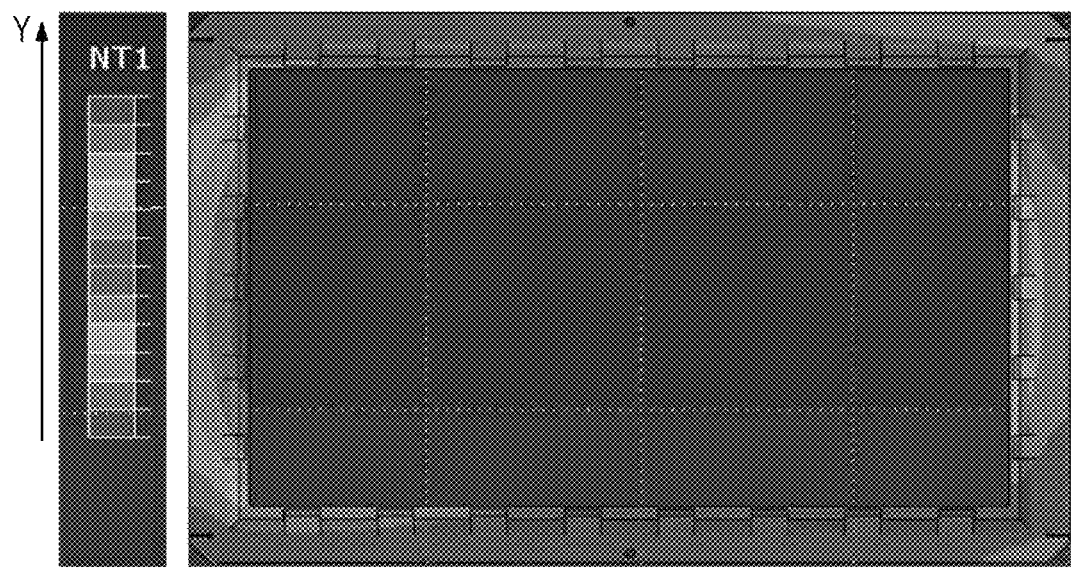
FIG. 9A is an image showing a result of a thermal analysis with respect to a mask frame according to a comparative example.
Figure 9B:
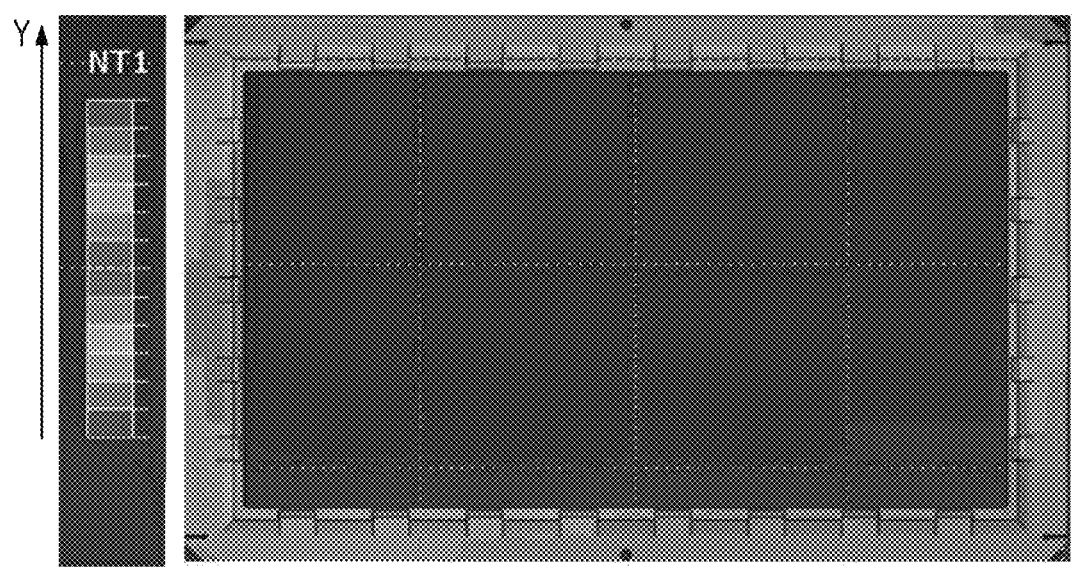
FIG. 9B is an image showing a result of a thermal analysis with respect to a mask frame according to an embodiment of the present inventive concepts.

FIGS. 9A and 9B are images showing results of a thermal analysis with respect to a mask frame according to a comparative example and a mask frame according to embodiment of the present inventive concepts. FIG. 9A shows a change in temperature due to the heat transfer in the mask frame of the comparative example that includes the support substrate and does not include the fixing portion and the heat dissipation plate in color. FIG. 9B shows a change in temperature due to the heat transfer in the mask frame of the embodiment of the present inventive concepts that includes the support substrate, the fixing portion, and the heat dissipation plate in color.

In FIGS. 9A and 9B, a Y-axis indicates a relative temperature, and the temperature increases from a lower side to an upper side. A first area of the mask frame that is positioned at the lower side of the Y-axis and shown in a color close to blue represents a lower temperature than a second area of the mask frame that is positioned at the upper side and shown in a color close to red.

The mask frame of FIG. 9A shows colors close to the upper side of the Y axis. The mask frame of FIG. 9B shows colors close to the lower side of the Y axis. When compared with the mask frame of the comparative example of FIG. 9A, the mask frame of an embodiment of the present inventive concepts shown in FIG. 9B represents a relatively lower temperature overall. In addition, as shown in FIG. 9A, a color difference in a left side of the mask frame of the comparative example is large, and thus, it may be concluded that a temperature difference in the mask frame of the comparative example is relatively large. However, as shown in FIG. 9B, an overall color difference is small in the mask frame of an embodiment of the present inventive concepts, and thus, it may be concluded that the temperature difference in the mask frame is not large.

Accordingly, in the mask frame including the heat dissipation plate disposed on the support substrate and the fixing portion disposed between the heat dissipation plate and the support substrate, the absorption rate of the heat radiation energy may be lowered, and the deformation of the mask frame due to the heat may be reduced or prevented.

The mask frame may include the support substrate including the inner side surfaces, the heat dissipation plate disposed on the inner side surfaces of the support substrate, and the fixing portions disposed between the support substrate and the heat dissipation plate. The heat dissipation plate may cover the inner side surfaces of the support substrate and may reduce or prevent the deformation of the support substrate, which is caused by the heat radiation energy generated in the deposition process. As the deformation of the support substrate due to the heat is reduced or prevented, the deposition accuracy of the deposition process using the mask frame may be increased.

The deposition apparatus may include the vacuum chamber and the mask frame disposed in the vacuum chamber. The deposition source and the mask may be disposed in the vacuum chamber, and the mask may be disposed above the mask frame. The mask frame may include the support substrate, the heat dissipation plate disposed on the support substrate, and the fixing portions disposed between the support substrate and the heat dissipation plate. As the heat dissipation plate is disposed on the support substrate, the absorption of the heat radiation energy, which is generated from the deposition source, by the support substrate may be reduced. Accordingly, the deformation of the support substrate due to the heat may be reduced or prevented, and the deposition accuracy of the deposition apparatus including the mask frame may be increased.

Although embodiments of the present inventive concepts have been described, it is understood that the present inventive concepts should not be limited to these embodiments but various changes and modifications can be made by one ordinary skilled in the art within the spirit and scope of the present inventive concepts.

Therefore, the disclosed subject matter should not be limited to any single embodiment described herein.

What is claimed is:

1. A mask frame comprising:
a support substrate including a plurality of inner side surfaces, the plurality of inner side surfaces defining a first opening through the support substrate;
a heat dissipation plate disposed on the plurality of inner side surfaces; and
a plurality of fixing portions disposed between the support substrate and the heat dissipation plate, the plurality of fixing portions includes a plurality of adhesive portions attaching the support substrate to the heat dissipation plate and a plurality of second openings defined there through adjacent to the plurality of adhesive portions.

2. The mask frame of claim 1, wherein the plurality of fixing portions are disposed directly between the support substrate and the heat dissipation plate.

3. The mask frame of claim 1, wherein:
the support substrate comprises:
a plurality of first overlap portions that overlaps the plurality of fixing portions; and
a plurality of first non-overlap portions that does not overlap the plurality of fixing portions, and the heat dissipation plate comprises:
a plurality of second overlap portions that overlaps the plurality of fixing portions; and
a plurality of second non-overlap portions that does not overlap the plurality of fixing portions.

4. The mask frame of claim 3, wherein first lateral side edge of the plurality of first overlap portions and first lateral side edge of the plurality of second overlap portions are substantially parallel to each other in a cross-section.

5. The mask frame of claim 1, wherein the heat dissipation plate and the support substrate are spaced apart from each other with the plurality of fixing portions interposed therebetween.

6. The mask frame of claim 1, wherein:
the support substrate comprises a first upper surface and a first lower surface spaced apart from the first upper surface in a first direction,
the heat dissipation plate comprises a second upper surface and a second lower surface spaced apart from the second upper surface in the first direction, and
a first height of the support substrate in a direction substantially perpendicular to the first upper surface and the first lower surface is the same as a second height of the heat dissipation plate in the direction substantially perpendicular to the second upper surface and the second lower surface.

7. The mask frame of claim 1, wherein:
the heat dissipation plate comprises a first surface adjacent to the support substrate and a second surface spaced apart from the first surface in a first direction; and
the second surface is mirror-finished.

8. The mask frame of claim 1, wherein:
the heat dissipation plate comprises a plurality of sub-heat dissipation plates; and
each of the plurality of sub-heat dissipation plates is disposed on the plurality of inner side surfaces.

9. The mask frame of claim 1, wherein the heat dissipation plate has an emissivity that is less than or equal to about 0.25.

10. The mask frame of claim 1, wherein the heat dissipation plate comprises at least one compound selected from Ag, Al, Cu, Cr, and Sn.

11. The mask frame of claim 1, wherein each of the plurality of fixing portions has a thickness in a range of about 0.05 mm to about 10 mm in a direction substantially perpendicular to the plurality of inner side surfaces and a side surface of the heat dissipation plate facing the plurality of inner side surfaces.

12. The mask frame of claim 1, wherein:
the support substrate comprises an upper surface and a lower surface spaced apart from the upper surface in a first direction; and
each of the plurality of inner side surfaces is inclined with respect to the upper surface and the lower surface.

13. The mask frame of claim 1, wherein the support substrate comprises invar.

14. The mask frame of claim 1, wherein:
the plurality of fixing portions includes three or more fixing portions; and
the three or more fixing portions are spaced apart from each other in a cross-section.

15. The mask frame of claim 1, wherein the support substrate and the plurality of fixing portions comprise a same metal material as each other.

* * * * *